United States Patent
Zhan et al.

(10) Patent No.: US 9,177,952 B2
(45) Date of Patent: Nov. 3, 2015

(54) ESD PROTECTION WITH ASYMMETRICAL BIPOLAR-BASED DEVICE

(71) Applicants: Rouying Zhan, Gilbert, AZ (US); Chai Ean Gill, Chandler, AZ (US); Changsoo Hong, Phoenix, AZ (US); Michael H. Kaneshiro, Chandler, AZ (US)

(72) Inventors: Rouying Zhan, Gilbert, AZ (US); Chai Ean Gill, Chandler, AZ (US); Changsoo Hong, Phoenix, AZ (US); Michael H. Kaneshiro, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/053,716

(22) Filed: Oct. 15, 2013

(65) Prior Publication Data

US 2015/0102384 A1 Apr. 16, 2015

(51) Int. Cl.

| | |
|---|---|
| *H01L 29/74* | (2006.01) |
| *H01L 29/747* | (2006.01) |
| *H01L 29/00* | (2006.01) |
| *H01L 21/331* | (2006.01) |
| *H01L 27/082* | (2006.01) |
| *H01L 29/73* | (2006.01) |
| *H01L 27/02* | (2006.01) |
| *H01L 29/66* | (2006.01) |
| *H01L 23/60* | (2006.01) |

(52) U.S. Cl.
CPC .......... *H01L 27/0262* (2013.01); *H01L 23/60* (2013.01); *H01L 27/0248* (2013.01); *H01L 29/66234* (2013.01); *H01L 29/73* (2013.01)

(58) Field of Classification Search
CPC .......... H01L 29/1083; H01L 29/7835; H01L 27/0623; H01L 29/1095; H01L 21/8249; H01L 29/7816; H01L 27/0255; H01L 29/1087; H01L 27/0259; H01L 29/0634; H01L 29/866; H01L 29/66681; H01L 29/7393; H01L 21/823878; H01L 27/0248; H01L 29/66106

USPC .................................... 257/168–178
See application file for complete search history.

(56) References Cited

U.S. PATENT DOCUMENTS

| 7,786,507 | B2* | 8/2010 | Denison et al. ............... 257/173 |
|---|---|---|---|
| 7,791,161 | B2* | 9/2010 | Zhu et al. ...................... 257/505 |
| 2008/0191277 | A1* | 8/2008 | Disney et al. .................. 257/343 |
| 2011/0176243 | A1* | 7/2011 | Zhan et al. ....................... 361/56 |
| 2011/0176244 | A1* | 7/2011 | Gendron et al. ................. 361/56 |
| 2012/0133025 | A1* | 5/2012 | Clarke et al. .................. 257/570 |
| 2012/0187538 | A1* | 7/2012 | Lin et al. ....................... 257/587 |
| 2014/0061716 | A1* | 3/2014 | Zhan et al. .................... 257/110 |

OTHER PUBLICATIONS

"High-voltage Asymmetrical Bi directional Device for System-level ESD Protection of Automotive Applications on a BiCMOS Technology", 35th Annual EOS/ESD Symposium, Sep. 8, 2013, 8 pages.*
Carol (Rouying) Zhan et al., "High-voltage Asymmetrical Bi-directional Device for System-level ESD Protection of Automotive Applications on a BiCMOS Technology", 35th Annual EOS/ESD Symposium, Sep. 8, 2013, 8 pages.
V.A. Vashchenko et al., "Implementation of Dual-Direction SCR Devices in Analog CMOS Process", EOS/ESD Symposium 07-75, Sep. 16-21, 2007, 1B.5-1-1B.5-5.

* cited by examiner

*Primary Examiner* — Marcos D. Pizarro
*Assistant Examiner* — Nelson Garces
(74) *Attorney, Agent, or Firm* — Lempia Summerfield Katz LLC

(57) ABSTRACT

An electrostatic discharge (ESD) protection device includes a semiconductor substrate comprising a buried insulator layer and a semiconductor layer over the buried insulator layer having a first conductivity type, and first and second bipolar transistor devices disposed in the semiconductor layer, laterally spaced from one another, and sharing a common collector region having a second conductivity type. The first and second bipolar transistor devices are configured in an asymmetrical arrangement in which the second bipolar transistor device includes a buried doped layer having the second conductivity type and extending along the buried insulator layer from the common collector region across a device area of the second bipolar transistor device.

18 Claims, 4 Drawing Sheets

ESD PROTECTION WITH ASYMMETRICAL BIPOLAR-BASED DEVICE

FIELD OF INVENTION

The present embodiments relate to semiconductor devices.

BACKGROUND

Integrated circuits (ICs) are at risk of damage due to electrostatic discharge (ESD) events. ESD events may be caused by an electrostatically charged person holding an IC chip. An ESD event may involve electrostatic potentials of 4000 Volts or more between input/output (I/O) terminals of the IC chip. During the ESD event, a discharge current typically flows between the I/O terminal and ground through vulnerable circuitry in the IC chip.

ESD protection devices are commonly incorporated into IC chips across terminals of the IC chip. ESD protection devices are often configured to protect such circuitry by providing another path to ground for the discharge current. For example, an ESD protection device may be connected between an I/O terminal and a ground or common terminal. The ESD protection device acts as a voltage limiter to prevent the voltage between the I/O terminal and the ground terminal from reaching levels that would otherwise harm other devices on the chip.

ESD protection devices are configured to remain quiescent while the voltage between the terminals falls within a normal operating range for the IC chip. When the voltage reaches a triggering voltage above that range, the ESD protection device turns on to shunt any damaging current to ground, thereby preventing damage to the IC chip. The triggering voltage of the ESD protection device should exceed the maximum normal operating voltage of the IC chip to avoid interfering with the normal operation of the IC chip.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Figure 1:
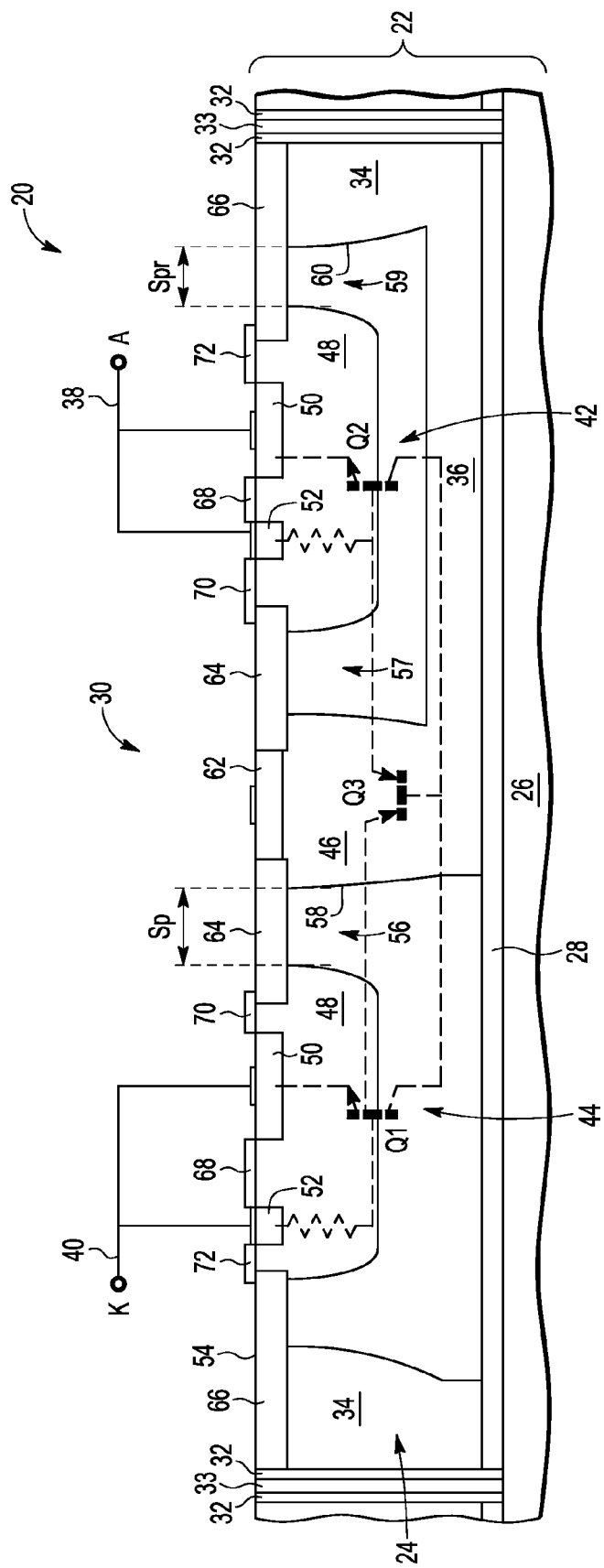
FIG. 1 is a cross-sectional, schematic, partial view of an exemplary ESD protection device with asymmetrical triggering and partial buried isolation in accordance with one embodiment.

Embodiments of electrostatic discharge (ESD) protection devices, such as ESD protection clamps, and electronic apparatus including such clamps or devices, are described. The disclosed embodiments are configured as dual polarity or bidirectional ESD protection devices. The bidirectional ESD protection may involve breakdown triggering to discharge ESD energy in the forward and reverse directions. Breakdown in the forward and reverse directions may occur at the same voltage level or different voltage levels. The disclosed embodiments may include a pair of bipolar transistor devices, e.g., NPN bipolar transistor devices, connected to respective terminals between which the ESD event occurs to provide the bidirectional protection. One transistor device (Q1) controls forward triggering, while the other transistor device (Q2) controls reverse triggering. The breakdown may involve an inner triggering junction in one polarity, e.g., the forward polarity, and an outer triggering junction in the other polarity, e.g., the reverse polarity.

The bipolar-based transistor devices may share a common collector. Unlike past bipolar-based ESD protection devices, the disclosed embodiments are not symmetrical or mirror-placed about the common collector. The bipolar-based transistor devices may be asymmetrical in one or more ways. The asymmetries may be useful in providing improvements in current capacity in one or both directions, e.g., the forward polarity and reverse polarity.

The asymmetrical nature of the bipolar-based ESD protection device may involve the presence or absence of a buried doped layer for each bipolar transistor device. The buried doped layer may not extend across the bipolar transistor device Q1 in some embodiments. Substrate isolation is instead provided by a buried insulator layer of, e.g., a semiconductor-on-insulator or silicon-on-insulator (SOI) substrate. The buried doped layer extends from the common collector across the bipolar transistor device Q2 to reach an outer isolation ring to isolate the transistor devices Q1 and Q2 from one another.

The electrical connection of the common collector and the outer isolation ring provides an alternative or additional option for asymmetry. The asymmetry may involve establishing an outer triggering junction for the bipolar transistor device Q2 along the outer isolation ring, rather than an inner triggering junction at or near the common collector. The outer triggering junction may be disposed along an outer edge or periphery of the ESD protection device. The outer position of the triggering junction may improve the reverse triggering time because the position helps the avalanche breakdown generated holes to turn on the base-emitter junction of device Q2 in the reverse polarity, e.g., in cases in which the base and emitter positions have been swapped as described below.

An alternative or additional asymmetry may involve swapping the position of base and emitter regions of the bipolar transistor device (Q2) responsible for reverse triggering. In these embodiments, the base of the bipolar transistor device Q2 is closer to the other bipolar transistor device Q1 than the emitter. With the swapped positioning, the current path from one terminal, e.g., an anode as described below, to the other terminal, e.g., a cathode as described below, becomes shorter. The shorter current path may lead to enhancement of parasitic silicon controlled rectifier (SCR) effects described below, which, in turn, may lead to higher current capability and lower snapback voltage in the forward polarity.

The asymmetries provide improvements in current capacity relative to previous symmetrical devices. The improvements may be achieved without any increases in device area.

The disclosed ESD protection devices are stackable, insofar as each bipolar transistor device is isolated from the substrate. For instance, the buried insulator layer of the SOI substrate may be combined with isolation trenches, e.g., deep isolation trench (DTI) regions, to isolate each bipolar transistor device from the substrate, e.g., a bulk or base substrate of an SOI substrate.

The ESD protection devices of the disclosed embodiments may be configured for robust ESD performance via the formation of a parasitic silicon controlled rectifier (SCR) device once the ESD event occurs. The SCR device may result from the presence of a parasitic bipolar transistor device, e.g., a PNP bipolar transistor device, formed by the pair of bipolar transistor devices. The formation of the parasitic bipolar transistor device may be based on the isolation resulting from the collector region reaching the buried doped layer.

The trigger voltages of the disclosed embodiments are adjustable. The spacing between base and sinker regions of the bipolar-based devices may be selected to achieve desired trigger voltage levels, as described below. The spacing may alternatively or additionally be set to establish a different breakdown triggering voltage in the forward and reverse directions.

The disclosed embodiments may be used to protect a variety of semiconductor devices having a wide range of operating voltages. Although described below in connection with electronic apparatus including LDMOS transistor devices, the disclosed embodiments may be configured to protect other semiconductor devices, such as bipolar transistor or other MOS devices. For example, in some embodiments, including some of those in which the protected devices include LDMOS transistor devices, the pins of the IC chip may be rated for operation at voltages as low as about 5 Volts to as high as about 105 Volts. The disclosed embodiments may be configured to accommodate such wide ranges of operating voltages via stacking or other serial arrangements of the disclosed ESD protection devices, as described below. The disclosed ESD protection devices may thus be used to accommodate different operating voltages on the same IC chip. Different operating voltages may alternatively or additionally be accommodated by varying the configuration, e.g., lateral width, and/or positioning of the sinker region, as described below.

Although described below in connection with NPN bipolar transistor devices, the disclosed devices are not limited to any particular transistor dopant configuration. The disclosed devices are not limited to NPN devices, as PNP and other types of devices may be provided by, for example, substitution of semiconductor regions of opposite conductivity type. Thus, for example, each semiconductor region, layer or other structure in the examples described below may have a conductivity type, e.g., n-type or p-type, opposite to the type identified in the examples below.

FIG. 1 is a schematic cross-sectional view of an example of an ESD protection device 20 constructed in accordance with one embodiment. Device 20 includes a semiconductor substrate 22, which may, in turn, include a number of epitaxial layers 24. In this example, semiconductor substrate 22 includes a p-type epitaxial layer 24 grown above a base substrate 26. Additional epitaxial layers may be grown. Base substrate 26 may be a heavily doped n-type semiconductor substrate, but a p-type substrate may also be used. The doping concentration level of base substrate 26 may also vary, and need not be heavily doped. Device 20 may alternatively or additionally include other semiconductor layers, e.g., non-epitaxial layers, in which one or more device regions are formed. Any one or more of the layers of semiconductor substrate 22 may include silicon. Alternative or additional semiconductor materials may be used in other embodiments.

Substrate 22 may include a buried insulator layer 28 between base substrate 26 and epitaxial layer(s) 24. Buried insulator layer 28 may include silicon oxide, e.g., $SiO_2$. Buried insulator layer 28 may have a thickness of about 0.3 µm, but other thicknesses, materials, and layers may be used. In some cases, base substrate 26 and buried insulator layer 28 may correspond with the silicon and insulator layers of a silicon-on-insulator (SOI) substrate. Substrate 22 may have other semiconductor-on-insulator constructions. Epitaxial layer 24 may be grown via conventional SOI techniques involving, for instance, a seed layer disposed on buried insulator layer 28.

The structural, material, and other characteristics of semiconductor substrate 22 may vary from the example shown. For example, additional, fewer, or alternative layers may be included in semiconductor substrate 22. Any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A device area 30 of device 20 is depicted in the cross-section of FIG. 1. In this embodiment, a lateral perimeter or periphery of device area 30 is defined by one or more isolation trenches. In this example, one or more ring-shaped deep trench isolation (DTI) regions 32 surround device area 30. DTI region(s) 32 may include an insulating material, such as $SiO_2$. The construction, materials, and other characteristics of DTI region(s) 32 may vary. For example, DTI region(s) 32 may be formed by etching the semiconductor material of epitaxial layer(s) 24. DTI region(s) 32 may isolate device area 30 from surrounding substrate 22 by laterally surrounding device area 30 and extending downward to reach the depth of buried insulator layer 28 or other device isolating layer.

The isolation trench(es) may include a substrate connection to bias substrate 22. In this example, the isolation trench includes a substrate tie 33 disposed between DTI regions 32. Substrate tie 33 may be configured as an inner conductive trench, such as a doped polysilicon plug, that extends from a surface of substrate 22 through buried insulating layer 28 to establish the electrical connection to base substrate 26.

Device area 30 may alternatively or additionally be defined by one or more outer sinker regions 34 in semiconductor substrate 22, e.g., epitaxial layer 24, along the lateral periphery of device area 30. Sinker region(s) 34 may be disposed between bipolar transistor device 42 and a lateral periphery of ESD protection device 20. Sinker region(s) 34 may thus be configured or act as doped device isolating regions. In this example, sinker region 34 is a ring-shaped, n-type well disposed inward of DTI region(s) 32 to laterally surround device area 30. As described below, sinker region 34 may be formed via a deep well implantation procedure used to form a device isolating region of other devices in semiconductor substrate 22 protected by ESD protection device 20.

In this embodiment, ESD protection device 20 includes a partial buried doped layer 36. In this example, buried doped layer 36 is an n-type buried layer disposed above buried insulator layer 28. Buried doped layer 36 may be formed or disposed in the original SOI substrate before the growth of epitaxial layer(s) 24. In this embodiment, buried doped layer 36 extends laterally across, e.g., under, a portion of device area 30 to electrically connect sinker region 34. The portion corresponds with one of the pair of bipolar transistor devices of ESD protection device 20, as described below. Buried doped layer 36 extends across the area of the bipolar transistor device, thereby isolating the device from the other bipolar transistor device of ESD protection device 20.

Buried doped layer 36 may also be configured to establish a desired current capacity for ESD protection device 20 through the formation of a parasitic SCR device, as described below. The isolating properties of buried doped layer 36 may be directed to forming the parasitic SCR device by electrically separating components of ESD protection device 20 from one another, as described below.

Buried doped layer 36 is disposed in semiconductor substrate 22 at a depth reached or reachable by sinker region(s) 34. Sinker region 34, buried doped layer 36, and another sinker region that forms a common collector as described below may together form an isolation tub for one of the bipolar transistor devices of ESD protection device 20. The isolation tub may be ring-shaped. Additional, fewer, or alternative doped device isolating layers or regions may be provided in the semiconductor substrate 22. Please see, for example, the exemplary embodiment of FIG. 3 described below, in which a buried doped layer extends across, and forms an isolation tub for, both bipolar transistor devices.

ESD protection device 20 may be part of an electronic apparatus having a number of terminals across which an ESD event may occur. The terminals may be or include any type of input/output (I/O) terminal, such as pins or pads. In this example, the electronic apparatus includes an anode terminal 38 and a cathode terminal 40. Cathode terminal 40 may correspond with a common or ground terminal of the electronic apparatus. However, the references to "anode" and "cathode" are provided only for convenience in description of the bidirectional nature of ESD protection device 20. As a dual polarity or bidirectional device, ESD protection device 20 is configured to shunt ESD discharge current between terminals 38, 40, and away from the protected devices of the electronic apparatus, regardless of which I/O terminal is positive or negative.

In addition to the pads, pins, or other external connection components of ESD protection device 20, anode and cathode terminals 38, 40 include one or more metal layers, interconnects, or other conductive connections, supported by semiconductor substrate 22 and passivated by one or more dielectric layers, which are not shown. Such metal layers, interconnects, or connections are depicted schematically in FIG. 1.

ESD protection device 20 is configured as a dual polarity device in which anode and cathode terminals 38, 40 are coupled to a pair of bipolar transistor devices 42, 44 laterally spaced from one another. Bipolar transistor device 44 is also labeled Q1. Bipolar transistor device 42 is also labeled Q2. Bipolar transistor device 42 and bipolar transistor device 44 are coupled to anode and cathode terminals 38, 40, respectively. In the embodiment of FIG. 1, bipolar transistor devices 42, 44 are configured as NPN bipolar transistor devices. During operation, bipolar transistor device 44 is configured for non-destructive breakdown in response to forward polarity ESD events in which anode terminal 38 is positive biased with reference to cathode terminal 40. Bipolar transistor device 42 is configured for non-destructive breakdown upon experiencing reverse polarity ESD events in which anode terminal 38 is negative biased with reference to cathode terminal 40. In some cases, the pair of bipolar transistor devices 42, 44 are configured such that the breakdown trigger voltage level Vt1 is the same for both the forward and reverse polarities. As described herein, ESD protection device 20 may be asymmetrically configured in one or more ways. For instance, ESD protection device 20 may have different triggering spacing, and thus different forward and reverse trigger voltages.

Bipolar transistor devices 42, 44 share a common collector region 46 in semiconductor substrate 22, e.g., the epitaxial layer 24. Collector region 46 may be centrally disposed between the other regions or components of bipolar transistor devices 42, 44. In this example, collector region 46 includes an n-type sinker region or well, e.g., a deep n-type well, that reaches and is electrically connected to buried doped layer 36. On either lateral side of collector region 46, each bipolar transistor device 42, 44 includes a respective base region 48 and an emitter region 50 within the base region 48. Base and emitter regions 48, 50 are electrically tied or otherwise connected to a respective one of terminals 38, 40. In this example, each base region 48 includes a p-type well in which a base contact region 52 is formed at a surface 54 of semiconductor substrate 22. Each emitter region 50 includes an n-type region at surface 54. Base contact region 52 and emitter region 50 are highly doped to establish or support an Ohmic contact or other low resistance connection to terminals 38, 40. The positions of base contact region 52 and emitter region 50 in each bipolar transistor device 42, 44 relative to common collector region 46 may be swapped, as described below.

Bipolar transistor devices 42, 44 include respective portions 56, 57 of epitaxial layer 24 laterally disposed between base region 48 and common collector region 46. Portions 56, 57 abut common collector region 46. The portion 56 defines a breakdown trigger junction 58 with common collector region 46 across which breakdown occurs to trigger conduction of ESD protection device 20 in the forward polarity, e.g., from anode 38 to cathode 40. A lateral width Sp of portion 56 of epitaxial layer 24 establishes a voltage level at which the forward polarity breakdown occurs. In this example, the lateral width or spacing Sp extends from a lateral boundary of the sinker well of common collector region 46 to inner lateral boundary of base region 48. In some embodiments, the lateral spacing may range from 0 to about 3.5 µm in ESD protection devices. In other embodiments, the lateral spacing Sp may range from about −0.5 µm to about 5 µm. In other embodiments, the lateral spacing Sp may be modulated through one or more additional wells formed in epitaxial layer 24 beyond the lateral extent of the sinker well of common collector region 46.

In the embodiment of FIG. 1, portion 57 of epitaxial layer 24 does not define a breakdown trigger junction for conduction of ESD protection device 20 in the reverse polarity. Instead, ESD protection device 20 has an asymmetrical configuration in which an outer portion 59 of epitaxial layer 24 is used to define a breakdown trigger junction 60 across which breakdown occurs to trigger conduction in the reverse polarity, e.g., from cathode to anode 38. Outer portion 59 is disposed between base region 48 of bipolar transistor device 42 and outer sinker region 34. A lateral width or spacing Spr of outer portion 59 establishes a voltage level at which the reverse polarity breakdown occurs. In this example, the lateral spacing Spr extends from an inner lateral boundary of outer sinker well 34 and an outer lateral boundary of base region 48. The lateral spacing Spr may fall in the ranges set forth above in connection with the lateral spacing Sp.

The lateral spacing Spr is less than the inner lateral spacing between the common collector region 46 and the base region 48 of the bipolar transistor device 42. That inner lateral spacing corresponds with the width of portion 57 of epitaxial layer 24. That inner lateral spacing is greater than the lateral spacing Spr to ensure that breakdown occurs along the outer edge of the bipolar transistor device 42 at breakdown trigger junction 60, rather than along the inner edge at common collector region 46.

As described below, outer sinker, collector, base, emitter, and base contact regions 34, 46, 48, 50, 52 may be formed via one or more respective power FET implants. Outer sinker and common collector regions 34, 46 may be formed by the same implant. In some cases, such regions may be composite regions formed by multiple power FET implants. In this embodiment, the outer sinker and common collector regions 34, 46 are not composite regions, but rather formed by a single deep or sinker implant, e.g., a deep n-well implant. In other embodiments, the outer sinker and/or collector regions 34, 46 may be a composite region in the sense that the region is formed via a combination of multiple well regions. The extent to which common collector region 46 is considered a composite region does not include the presence of a collector contact region 62 at surface 54. Collector contact region 62 is optional in some cases, insofar as common collector region 46 may be floating during operation.

A number of shallow trench isolation (STI) regions 64, 66 may be formed at surface 54 in semiconductor substrate 22. In this embodiment, one or more inner STI region(s) 64 are disposed laterally adjacent to collector contact region 62. STI region(s) 64 may extend over portions 56, 57 of epitaxial layer 24. In some embodiments, inner STI region 64 is a single STI region. One or more outer STI regions 66 are disposed adjacent DTI regions 32 over outer sinker region 34. In some embodiments, outer STI region 66 is a single, ring-shaped STI region disposed along the lateral periphery of ESD protection device 20. Outer STI region 66 may extend over portion 59 of epitaxial layer 24. In some cases, STI regions 64, 66 may be connected to one another.

A number of silicide blocks 68, 70, 72 may be formed on surface 54 to isolate contacts for each of the above-referenced contact regions. In this example, silicide blocks 68, 70, 72 are supported by semiconductor substrate 22 and positioned adjacent contacts for anode and cathode terminals 38, 40. For example, silicide blocks 68 are positioned between respective base and emitter contacts of each bipolar transistor device 42, 44. Silicide blocks 70 are positioned between the contact for common collector region 46 and the other device terminals of bipolar transistor devices 42, 44. Silicide blocks 72 are positioned along the outer boundary of each bipolar transistor device 42, 44.

During operation in forward polarity, when a positive ESD stress is applied to anode terminal 38 with reference to cathode terminal 40, bipolar transistor device 42 acts as a forward-biased diode. Collector-base junction 58 of the other bipolar transistor device 44 is reverse-biased, and the breakdown trigger voltage Vt1 of ESD protection device 20 is determined by the collector-to-base spacing, or lateral width Sp, provided by portion 56 of epitaxial layer 24. With an applied voltage larger than the breakdown trigger voltage level Vt1, bipolar transistor device 44 turns on, thereby forming a parasitic silicon controlled rectifier (SCR) device with a parasitic PNP bipolar transistor device Q3. The parasitic SCR device provides strong ESD robustness for ESD protection device 20.

In reverse polarity operation, when a negative stress is applied to anode terminal 38 with reference to cathode terminal 40, bipolar transistor device 44 acts as a forward-biased diode. The reverse breakdown trigger voltage level Vt1 of ESD protection device 20 is determined by the collector-to-base spacing, or lateral width Spr, provided by portion 59 of epitaxial layer 24 along the lateral periphery of ESD protection device 20. ESD protection device 20 is thus configured as a dual polarity ESD protection device.

ESD protection device 20 is configured such that the voltage level at common collector region 46 and buried doped layer 36 floats. Common collector region 46, buried doped layer 36, and outer sinker region(s) 34 are not electrically tied or connected to either of terminals 38, 40. The electrical connection of common collector region 46 and buried doped layer 36 isolates the p-type wells of the respective base regions 48 of the pair of bipolar transistor devices 42, 44. In the embodiment of FIG. 1, each base region 48 is isolated or electrically separated from the base and emitter regions 48, 50 of the other bipolar transistor device 42, 44. Such isolation allows one of the p-type wells to form the forward-biased diode during operation. The diode is formed between the p-type well of base region 48 and buried doped layer 36 and/or common collector region 46. The p-type side of the diode may also include a portion of epitaxial layer 24. The diode is formed on the side of device 20 electrically tied or connected to the terminal 38, 40 having the relatively higher voltage.

Once a forward biased diode is established on one side, common collector region 46 and buried doped layer 36 may reach a voltage level that depletes the respective portion of epitaxial layer 24 at which breakdown occurs, e.g., either portion 56 or portion 59. Eventually such depletion leads to an ESD event involving breakdown of junction 58 or junction 60. Using a forward breakdown event as an example, the ESD event forms the parasitic SCR device to shunt the ESD discharge current between terminals 38, 40. The SCR device provides strong current capability for this device, which may be useful in, for instance, supporting a suitable thermal damage point, e.g., a high thermal damage current level It2, for a given size of ESD protection device 20. In a forward ESD event, e.g., with terminal 38 as the anode, charge carriers, e.g., electrons and holes, are shunted from cathode terminal 40 and emitter region 50 of bipolar transistor device 44 to the base region 48 and anode terminal 38 of bipolar transistor device 42, as described below.

The parasitic SCR device includes common collector region 46, including buried doped layer 36, base region 48, and emitter region 50 of bipolar transistor device 44, and the p-type well of base region 48 of bipolar transistor device 42. As shown in FIG. 1, the parasitic SCR device may be considered to include parasitic PNP bipolar transistor device Q3 formed via the above-referenced p-type regions, e.g., the p-type well regions of the base regions and the p-type epitaxial layer, and the n-type common collector region 46 and buried doped layer 36.

The substrate isolation provided by buried insulating layer 28 allows ESD protection device 20 to be stackable. For example, multiple ESD protection devices may be arranged in series to form a multi-device ESD clamp having a breakdown trigger voltage level Vt1 that approximately equals or otherwise corresponds with the sum of the individual trigger voltage levels Vt1. The series arrangement may involve connecting the anode electrodes of a top or upper ESD protection device to a pin or other I/O terminal, connecting the cathode electrodes of the top ESD protection device to the anode electrodes of a bottom or lower ESD protection device, and connecting the cathode electrodes of the bottom ESD protection to ground or another I/O terminal or another ESD protection device. In one example with two ESD protection devices each having trigger voltage levels of 40 Volts, the stacked or series arrangement provides a trigger voltage level of 80 Volts. Pins with different operating voltage levels on the same IC chip may thus be provided with proper ESD protection. The voltage level of the snapback point Vsb for the ESD clamp may also approximately equal the sum of the individual snapback voltage levels. Further details regarding the stacking of ESD clamps or other protection devices are provided in U.S. Patent Publication No. 2011/0176243.

ESD protection device 20 includes multiple asymmetries to improve current capacity and/or other device performance characteristics while remaining stackable. In the embodiment of FIG. 1, buried doped layer 36 extends laterally across extends along buried insulator layer 28 from common collector region 46 across a device area of bipolar transistor device 42. Buried doped layer 36 may thus extend laterally across only half of device area 30, rather than across the entire device area 30.

Another asymmetry of the embodiment of FIG. 1 involves the use of different sinker wells to establish breakdown triggering junctions 58, 60 for the forward and reverse polarity modes of operation. One triggering junction 58 is an inner junction established by common collector region 46, which is configured as a sinker well region that extends from surface 54 to reach buried doped layer 36. Surface 54 may be defined by epitaxial layer 24 or another semiconductor layer of substrate 22. The other triggering junction 60 is an outer junction established by outer sinker well region 34 spaced from bipolar transistor device 42 and also configured to reach buried doped layer 36. The sinker region of common collector region 46 defines inner triggering junction 58 during operation in the forward polarity mode in which bipolar transistor device 42 is operative as a forward-biased diode. Outer sinker region 34 defines outer triggering junction 60 during operation in a reverse polarity mode in which bipolar transistor device 44 is operative as a forward-biased diode. Outer sinker region 34 may be configured as a ring along the lateral periphery of ESD protection device 20. The asymmetrical arrangement of ESD protection device 20 may thus include or involve inner triggering junction 58 defined along common collector region 46 for operation in a first, e.g., positive, polarity mode and outer triggering junction 60 defined along a lateral periphery of ESD protection device 20 for operation in a second, e.g., negative, polarity mode.

Another asymmetry of the embodiment of FIG. 1 involves or includes different positioning of respective emitter and base contact regions 50, 52 of bipolar transistor devices 42, 44 relative to common collector region 46. In this example, in bipolar transistor device 42, base contact region 52 is closer to common collector region 46 than emitter region 50. The opposite is true in bipolar transistor device 44 in this embodiment, where emitter region 50 is closer to common collector region 46 than base contact region 52.

Figure 2:
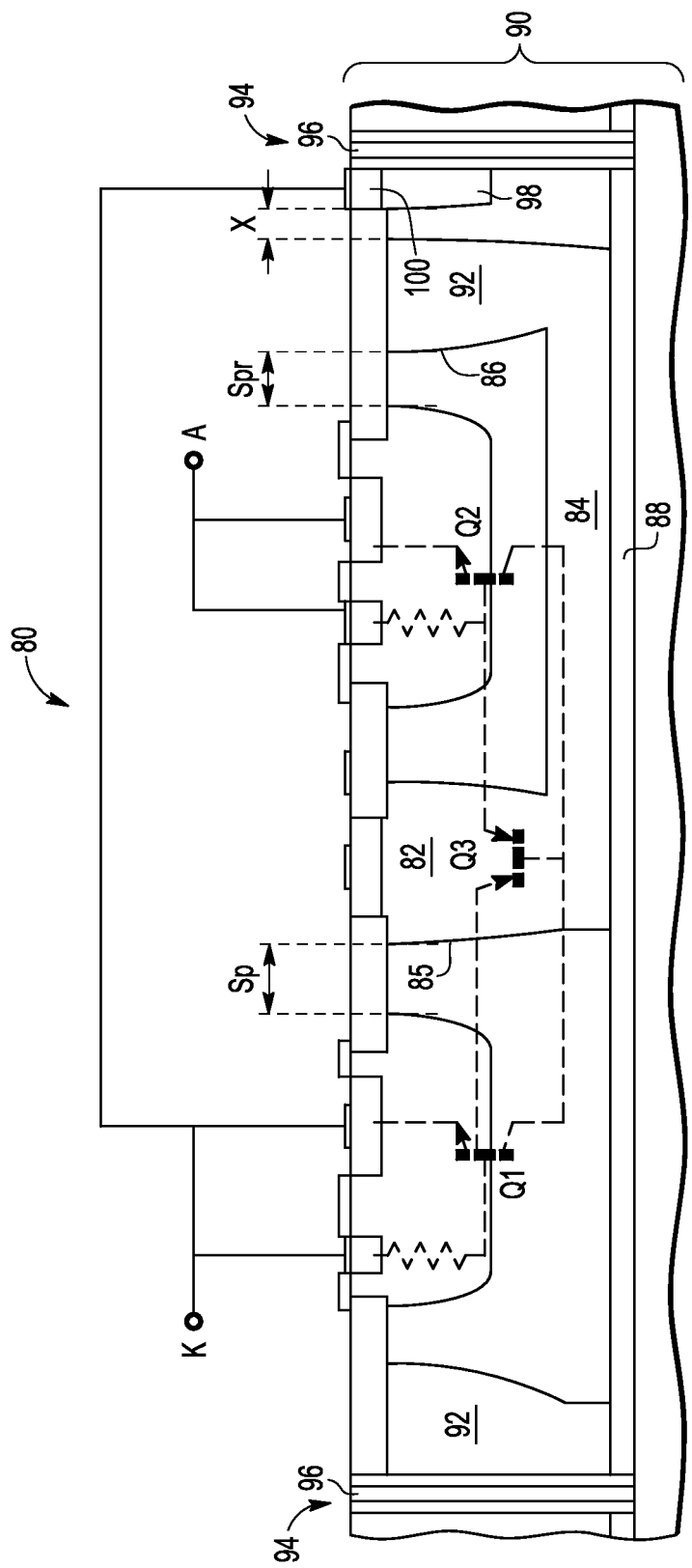
FIG. 2 is a cross-sectional, schematic, partial view of another exemplary ESD protection device with asymmetrical triggering and partial buried isolation in accordance with one embodiment.

FIG. 2 depicts an ESD protection device 80 in accordance with an embodiment having one or more additional or alternative asymmetries. ESD protection device 80 is configured as another dual polarity ESD protection device similar in several respects to the above-described devices. For example, ESD protection device 80 includes a pair of NPN bipolar transistor devices Q1 and Q2 and a common collector region 82 that may be configured and operable as described above. ESD protection device 80 also includes the asymmetries described above in connection with a partial buried doped layer 84, swapped base/emitter regions, and inner and outer breakdown triggering junctions 85, 86 for transistor devices Q1 and Q2, respectively. Buried doped layer 84 is disposed along a buried insulator layer 88 of an SOI substrate 90. Inner and outer triggering junctions 85, 86 are established along common collector region 82 and outer sinker region 92, respectively. Common collector region 82 may again be configured as an inner sinker well region electrically connected to outer sinker region 92 by buried doped layer 84. Breakdown occurs in accordance with spacings Sp and Spr as described above. Device isolation is again provided by a DTI ring 94 having an inner trench substrate tie 96. During operation, ESD protection device 80 may form a parasitic SCR device based on a parasitic PNP transistor device Q3 as described above.

ESD protection device 80 differs from the above-described embodiments in connection with an asymmetry involving operation in the reverse polarity mode. The asymmetry involves the situation in which bipolar transistor device Q1 acts as a forward-biased diode due to a negative voltage applied to the anode terminal A relative to the cathode terminal K. In this embodiment, an outer diode is formed between bipolar transistor device Q2 and the lateral periphery of device 80. The outer diode includes a p-type well region 98 electrically tied to a cathode terminal K and, accordingly, base and emitter regions of bipolar transistor device Q1. Outer well region 98 is disposed between sinker region 92 and the lateral periphery of device 80. A highly doped contact region 100 is disposed at the surface of SOI substrate 90 to establish an Ohmic contact for the connection. The outer diode also includes the n-type doped region of outer sinker region 92, which may be laterally spaced from well region 98 by a distance X, which may vary.

The presence of the outer diode may improve trigger times during operation in the reverse polarity mode. The outer diode is closer to bipolar transistor device Q2 than the diode formed by bipolar transistor device Q1 during an ESD event in which cathode K is positive relative to anode A. The proximity of outer diode to bipolar transistor device Q2 improves the trigger time until conduction of bipolar transistor device Q2 when the diode junction is forward biased.

Figure 3:
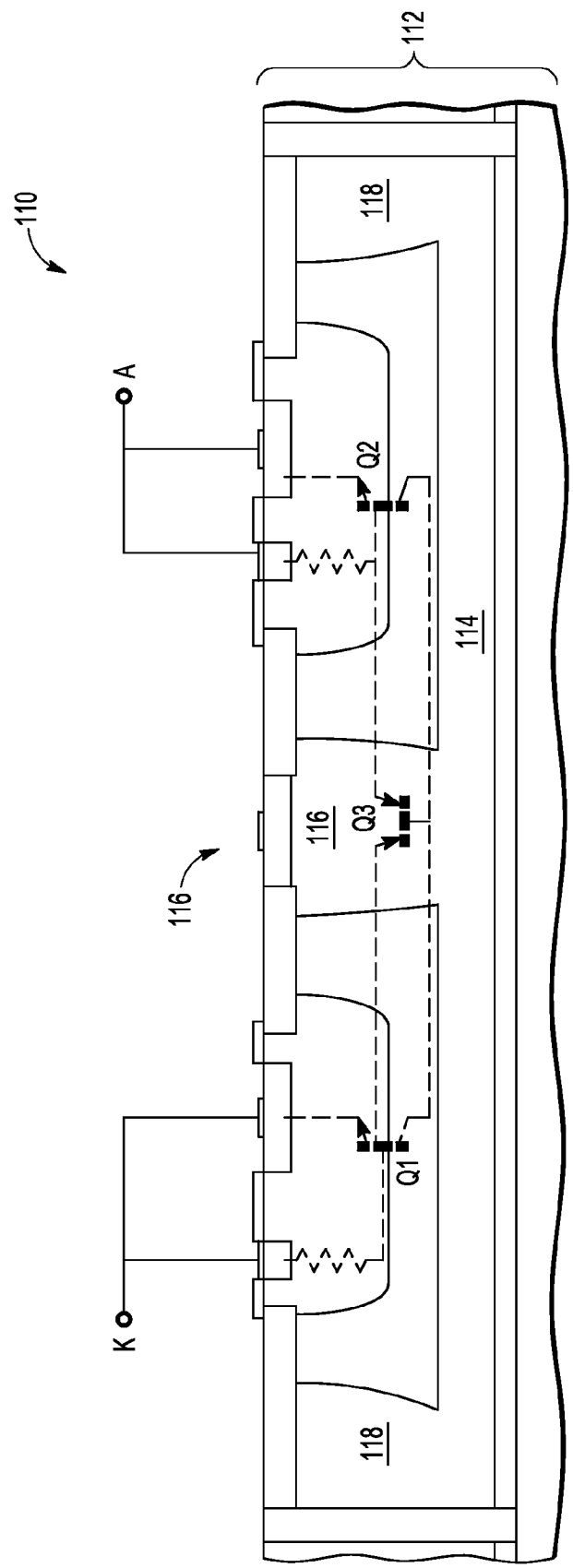
FIG. 3 is a cross-sectional, schematic, partial view of yet another exemplary ESD protection device with asymmetrical triggering in accordance with one embodiment.

The outer diode may be incorporated into any of the embodiments described herein FIG. 3 depicts another ESD protection device 110 in accordance with an embodiment configured similarly in numerous ways with the above-described devices. ESD protection device 110 is also a dual polarity device having bipolar transistor devices Q1 and Q2 formed in an SOI substrate 112 and coupled to cathode K and anode A terminals. ESD protection device 110 may include a number of the asymmetries described above to improve conduction, triggering times, or other aspects of operation in which parasitic bipolar transistor device Q3 is formed.

ESD protection device 110 differs from the above-described embodiments in connection with buried doped layer 114. In this embodiment, buried doped layer 114 extends across an entire extent of a device area 116 of ESD protection device 110. Buried doped layer 114 thus extends laterally across the entire lateral extent of both bipolar transistor devices Q1, Q2. Buried doped layer 114 again electrically connects an inner sinker well region 116, acting as a common collector region, and an outer sinker well region 118.

The above-described devices are shown in simplified form. For example, FIGS. 1-3 do not show the metal layers configured for electric coupling with the various regions and structures of the devices. The devices may have a number of other structures or components for connectivity, isolation, passivation, and other purposes not shown in FIGS. 1-3 for ease in illustration. For instance, the devices may include any number of additional isolating regions or layers, e.g., in addition to those described above and in addition to the silicide blocks shown.

The dopant concentrations, thicknesses, and other characteristics of the above-described semiconductor regions in the above-described semiconductor substrates may vary. In one example of the embodiment shown in FIG. 1, the above-referenced semiconductor regions may have the following approximate concentrations and thicknesses:

| | Concentration | Thickness |
|---|---|---|
| epitaxial 24: | $1 \times 10^{15}$-$8 \times 10^{15}$/cm$^3$ | 3-6 µm |
| substrate 26: | $1 \times 10^{15}$-$1 \times 10^{18}$/cm$^3$ | not applicable |
| outer sinker 34: | $1 \times 10^{16}$-$1 \times 10^{19}$/cm$^3$ | varies to reach layer 36 |

-continued

|  | Concentration | Thickness |
|---|---|---|
| buried doped layer 36: | $1 \times 10^{18}$-$8 \times 10^{19}$/cm$^3$ | 1-3 μm |
| collector 46: | $1 \times 10^{16}$-$1 \times 10^{19}$/cm$^3$ | varies to reach layer 36 |
| base 48: | $1 \times 10^{16}$-$1 \times 10^{19}$/cm$^3$ | 0.5 μm or to any level above layer 36 |
| emitter 50: | $5 \times 10^{19}$-$5 \times 10^{21}$/cm$^3$ | 0.15-0.3 μm |
| contact 52: | $1 \times 10^{19}$-$5 \times 10^{21}$/cm$^3$ | 0.15-0.3 μm |

The concentrations and thicknesses may be different in other embodiments. For example, the dopant concentration of the original substrate 26 may vary considerably.

Figure 4:
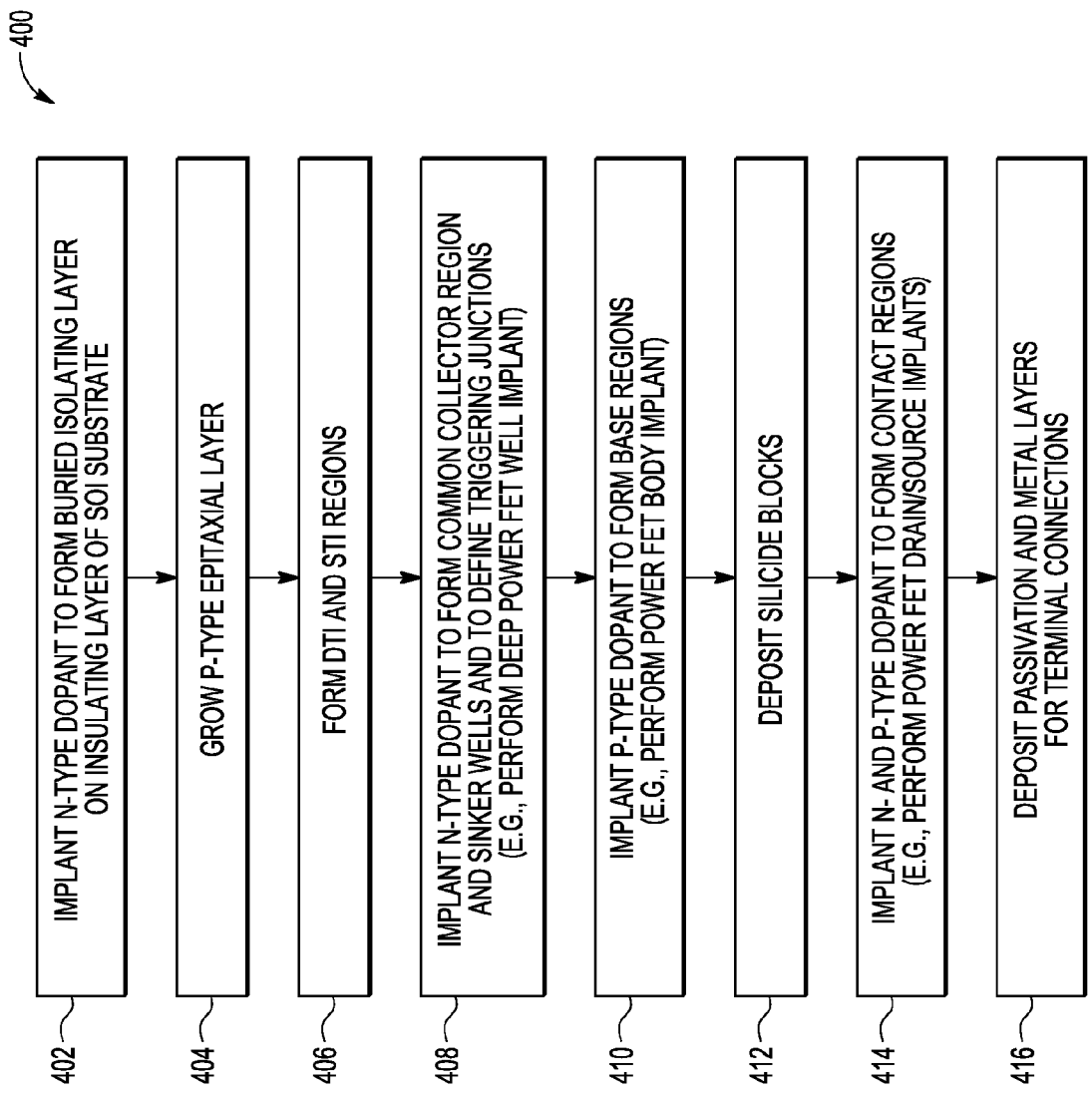
FIG. 4 is a flow diagram of an exemplary fabrication sequence to construct an ESD protection device with asymmetrical triggering via a sinker implant in accordance with one embodiment.

FIG. 4 shows an exemplary fabrication method 400 for fabricating an ESD protection device in an electronic apparatus. The method may be directed to fabricating a dual polarity ESD protection device having one or more of the asymmetries and other features described above. The ESD protection device is fabricated with a semiconductor substrate, the regions or layers of which may have the conductivity types of the examples described above, or be alternatively configured with opposite conductivity types. The method includes a sequence of steps or acts, only the salient of which are depicted for convenience in illustration. The ordering of the steps may vary in other embodiments. For example, one or more implants directed to forming a common collector region may be implemented after an implant directed to forming a base region. The fabrication method is not limited to any particular doping mechanism, and may include future developed doping techniques.

Method 400 may begin with, or include, a step 402 in which an n-type layer is formed via, e.g., an n-type implant procedure, in a semiconductor layer of a semiconductor substrate. The semiconductor layer may be a p-type layer of an SOI substrate having a base substrate and a buried insulating layer between the base substrate and the semiconductor layer. A p-type epitaxial layer may then be grown on the original semiconductor substrate in a step 404 to define a surface of the semiconductor layer of the substrate. Any number of epitaxial layers may be grown. With the growth of the epitaxial layer, the n-type layer is configured as a buried doped layer. The buried doped layer may be patterned via a mask to extend across a portion or all of a device area of the ESD protection device, as described above. The mask may thus be configured to define an asymmetrical arrangement of the bipolar transistor devices of the ESD protection device in which the buried doped layer extends along the buried insulator layer from a common collector region across a device area of one of the bipolar transistor devices, as described above.

Any number of STI and DTI regions may then be formed in the substrate in a step 406. The STI and DTI regions may be formed via any now known or hereafter developed procedure. For example, step 406 may include the formation of a trench and the deposition via, e.g., chemical vapor deposition (CVD), of one or more materials in the trench. In some embodiments, the trench is filled with silicon oxide. Additional or alternative materials may be deposited to fill the trench or to damage the substrate. In an alternative embodiment, the STI and/or DTI regions are formed after one or more regions or components of the ESD protection device are formed. Step 406 may also include the formation of an inner trench substrate tie as described above in which a conductive material, e.g., doped polysilicon, is deposited to form a plug or other tie that extends from a surface of the semiconductor layer through the buried insulating layer to electrically connect to the base substrate.

In a step 408, inner and outer sinker well regions of the ESD protection device are formed in the semiconductor substrate via one or more dopant implant procedures. The procedure(s) may be also used to form one or more sinker regions, e.g., device isolating regions, of a power FET device. In some embodiments, the implants are configured to implant n-type dopant. In the exemplary method of FIG. 4, a deep power FET well implant is used to form the sinker well regions. The inner sinker well region may act as a common collector region as described above. The sinker implant is configured such that the inner and outer sinker regions extend through the semiconductor layer to reach the buried doped layer.

In a step 410, base regions of the ESD protection device are formed in the semiconductor substrate via a dopant implant procedure that may be used to form one or more regions of the power FET device. The dopant type, e.g., p-type, is opposite that of the collector implants. The dopant implant may be directed to forming a body region of the power FET device, such as a body of an LDMOS device. A mask for the dopant implant procedure spaces the base region from the collector region as described above.

The well implantation procedures of steps 408 and 410 are configured such that conduction of one bipolar transistor device is triggered by breakdown between the inner sinker region and the base region of thereof, and such that conduction of the other bipolar transistor device is triggered by breakdown between the outer sinker region and the base region thereof.

In a step 412, a number of silicide blocks are formed. The silicide blocks may act as hard masks for a number of implantation procedures. After the silicide blocks are formed, respective contact regions are formed for the base and collector regions in a step 414. The contact regions may be formed by n-type and p-type source/drain implants for the power FET device. One or more emitter regions may be formed by the n-type implant as well.

After the base contact and emitter regions are formed, the surface of the semiconductor substrate may be passivated via deposition of one or more dielectric layers in a step 416. The passivation or dielectric layers may be patterned to allow one or more conductive (e.g., metal) layers to be deposited in the act 416 to establish the above-described electrical terminal connections, such as the interconnects linking the base and emitter regions and the I/O terminals.

Additional steps or acts may be implemented at various points during the fabrication procedure. For example, one or more metal layers may be deposited or otherwise formed. Any number of additional passivation layers may be deposited or formed to allow interconnects to be defined in such additional layers.

The disclosed ESD protection devices are configured to provide high current capacity through an asymmetrical configuration. The asymmetrical configuration may involve differences in a buried doped layer. The disclosed devices may also be asymmetrical in connection with the location of junctions at which breakdown occurs. Additional asymmetries may be present in the orientation of base and emitter regions of the bipolar transistor devices.

In a first aspect, an ESD protection device includes a semiconductor substrate comprising a buried insulator layer and a semiconductor layer over the buried insulator layer having a first conductivity type, and first and second bipolar transistor devices disposed in the semiconductor layer, laterally spaced from one another, and sharing a common collector region having a second conductivity type. The first and second bipolar transistor devices are configured in an asymmetrical arrangement in which the second bipolar transistor device includes a buried doped layer having the second conductivity type and extending along the buried insulator layer from the common collector region across a device area of the second bipolar transistor device.

In a second aspect, an electronic apparatus includes a semiconductor substrate comprising a buried insulator layer and a semiconductor layer over the buried insulator layer having a first conductivity type, a pair of terminals supported by the semiconductor substrate, and a dual polarity electrostatic discharge (ESD) protection device disposed in the semiconductor layer and including first and second bipolar transistor devices and inner and outer sinker regions having a second conductivity type and extending through the semiconductor layer to reach the buried insulator layer. The inner sinker region is configured as a common collector region of the first and second bipolar transistor devices. The outer sinker region is disposed between the second bipolar transistor device and a lateral periphery of the dual polarity ESD protection device. The first and second bipolar transistor devices are configured in an asymmetrical arrangement in which conduction of the first bipolar transistor device is triggered by breakdown at a first junction along the inner sinker region and in which conduction of the second bipolar transistor device is triggered by breakdown at a second junction along the outer sinker region.

In a third aspect, a method of fabricating an ESD protection device includes forming a buried doped layer in a semiconductor layer of a semiconductor substrate including a base substrate and a buried insulating layer between the base substrate and the semiconductor layer, the semiconductor layer and the buried doped layer having first and second conductivity types, respectively. The method further includes performing a first well implantation procedure to implant dopant of the second conductivity type in the semiconductor layer to form inner and outer sinker regions. The inner sinker region is configured to establish a common collector region of first and second bipolar transistor devices of the ESD protection device. The method further includes performing a second well implantation procedure to implant dopant of the first conductivity type in the semiconductor layer to form respective base regions of the first and second bipolar transistor devices. The first well implantation procedure is configured such that the inner and outer sinker regions extend through the semiconductor layer to reach the buried doped layer. The first and second well implantation procedures are configured such that conduction of the first bipolar transistor device is triggered by breakdown between the inner sinker region and the base region of the first bipolar transistor device and such that conduction of the second bipolar transistor device is triggered by breakdown between the outer sinker region and the base region of the second bipolar transistor region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides, e.g., nitrides, oxy-nitride mixtures, etc. Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. An electrostatic discharge (ESD) protection device comprising:
   a semiconductor substrate comprising a buried insulator layer and a semiconductor layer over the buried insulator layer having a first conductivity type; and
   first and second bipolar transistor devices disposed in the semiconductor layer, laterally spaced from one another, and sharing a common collector region having a second conductivity type;
   wherein the first and second bipolar transistor devices are configured in an asymmetrical arrangement in which the second bipolar transistor device comprises a buried doped layer having the second conductivity type and extending along the buried insulator layer from the common collector region across a device area of the second bipolar transistor device.

2. The ESD protection device of claim 1, wherein the common collector region is configured as a sinker region that extends from a surface of the semiconductor layer to reach the buried doped layer.

3. The ESD protection device of claim 2, further comprising an outer sinker region spaced from the second bipolar transistor device and configured to reach the buried doped layer, wherein:
   the common collector region establishes a triggering junction during operation in a forward polarity mode in which the second bipolar transistor device is operative as a forward-biased diode; and
   the outer sinker region establishes a triggering junction during operation in a reverse polarity mode in which the first bipolar transistor device is operative as a forward-biased diode.

4. The ESD protection device of claim 3, wherein the outer sinker region is configured as a ring along a lateral periphery of the ESD protection device.

5. The ESD protection device of claim 1, wherein the asymmetrical arrangement further comprises an inner triggering junction defined along the common collector region for operation in a first polarity mode and an outer triggering junction defined along a lateral periphery of the ESD protection device for operation in a second polarity mode.

6. The ESD protection device of claim 5, further comprising:
   a sinker region adjacent the second bipolar transistor device, having the second conductivity type, and electrically coupled to the common collector region by the buried doped layer; and
   an outer diode region having the first conductivity type, disposed between the sinker region and the lateral periphery of the semiconductor device to define a diode junction, and electrically coupled to base and emitter regions of the first bipolar transistor device to trigger conduction of the second bipolar transistor device when the diode junction is forward biased.

7. The ESD protection device of claim 1, wherein the asymmetrical arrangement further comprises different positioning of respective base contact and emitter regions of the first and second bipolar transistor devices relative to the common collector region.

8. The ESD protection device of claim 7, wherein:
in the first bipolar transistor device, the emitter region is closer to the common collector region than the base contact region; and
in the second bipolar transistor device, the base contact region is closer to the common collector region than the emitter region.

9. The ESD protection device of claim 1, further comprising an isolation trench defining a lateral periphery of the ESD protection device and comprising an inner conductive trench tie that extends from a surface of the semiconductor layer through the buried insulating layer to electrically connect to a base substrate of the semiconductor substrate.

10. An electronic apparatus comprising:
a semiconductor substrate comprising a buried insulator layer and a semiconductor layer over the buried insulator layer having a first conductivity type;
a pair of terminals supported by the semiconductor substrate; and
a dual polarity electrostatic discharge (ESD) protection device disposed in the semiconductor layer and comprising first and second bipolar transistor devices and inner and outer sinker regions having a second conductivity type and extending through the semiconductor layer to reach the buried insulator layer;
wherein the inner sinker region is configured as a common collector region of the first and second bipolar transistor devices;
wherein the outer sinker region is disposed between the second bipolar transistor device and a lateral periphery of the dual polarity ESD protection device; and
wherein the first and second bipolar transistor devices are configured in an asymmetrical arrangement in which conduction of the first bipolar transistor device is triggered by breakdown at a first junction along the inner sinker region and in which conduction of the second bipolar transistor device is triggered by breakdown at a second junction along the outer sinker region.

11. The electronic apparatus of claim 10, wherein the second bipolar transistor device comprises a buried doped layer having the second conductivity type, and extending along the buried insulator layer from the common collector region across a device area of the second bipolar transistor device.

12. The electronic apparatus of claim 10, wherein:
the conduction of the first bipolar transistor device is triggered at the first junction during operation in a forward polarity mode in which the second bipolar transistor device is operative as a forward-biased diode; and
the conduction of the second bipolar transistor device is triggered at the second junction during operation in a reverse polarity mode in which the first bipolar transistor device is operative as a forward-biased diode.

13. The electronic apparatus of claim 10, wherein the outer sinker region is configured as a ring along a lateral periphery of the ESD protection device.

14. The electronic apparatus of claim 10, further comprising an outer diode region having the first conductivity type, disposed between the outer sinker region and the lateral periphery of the ESD protection device to define a diode junction, and electrically coupled to base and emitter regions of the first bipolar transistor device to trigger conduction of the second bipolar transistor device when the diode junction is forward biased.

15. The electronic apparatus of claim 10, wherein the asymmetrical arrangement further comprises different positioning of respective base and emitter regions of the first and second bipolar transistor devices relative to the common collector region.

16. The electronic apparatus of claim 10, further comprising an isolation trench defining a lateral periphery of the ESD protection device and comprising an inner conductive trench tie that extends from a surface of the semiconductor layer through the buried insulator layer to electrically connect to a base substrate of the semiconductor substrate.

17. The electronic apparatus of claim 11, wherein the inner and outer sinker regions are electrically coupled to one another by the buried doped layer.

18. The electronic apparatus of claim 11, wherein the asymmetrical arrangement further comprises the buried doped layer not extending across a device area of the first bipolar transistor device.

* * * * *